United States Patent
Brunn et al.

(10) Patent No.: US 6,912,698 B1
(45) Date of Patent: Jun. 28, 2005

(54) SKEW LOTS FOR IC OSCILLATORS AND OTHER ANALOG CIRCUITS

(75) Inventors: Brian T. Brunn, Austin, TX (US); Brian K. Seemann, Lakeville, MN (US)

(73) Assignee: Xilinx, Inc., San Jose, CA (US)

( * ) Notice: Subject to any disclaimer, the term of this patent is extended or adjusted under 35 U.S.C. 154(b) by 78 days.

(21) Appl. No.: 10/155,301

(22) Filed: May 23, 2002

(51) Int. Cl.[7] .............................................. G06F 17/50
(52) U.S. Cl. ................................ 716/2; 716/4; 716/11; 716/12; 716/13
(58) Field of Search ............................ 716/2, 4, 12, 13, 716/1, 14, 19; 365/203; 257/284, 288, 368

(56) References Cited

U.S. PATENT DOCUMENTS

| | | | |
|---|---|---|---|
| 6,013,926 A | * | 1/2000 | Oku et al. .................. 257/284 |
| 6,229,164 B1 | * | 5/2001 | Momose et al. ............ 257/288 |
| 6,282,135 B1 | * | 8/2001 | Proebsting .................. 365/203 |
| 6,515,338 B1 | * | 2/2003 | Inumiya et al. ............. 257/368 |

* cited by examiner

*Primary Examiner*—Thuan Do
(74) *Attorney, Agent, or Firm*—Eduardo Drake; B. Hoffman; John King

(57) ABSTRACT

Integrated circuits, key components in thousands of products, frequently include thousands and even millions of microscopic transistors and other electrical components. Because of difficulties and costs of fabricating these circuits, circuit designers sometimes ask fabricators to produce skew lots for testing and predicting manufacturing yield. However, conventional skew lots for CMOS circuits, which are based on increasing or decreasing transistor transconductance, are not very useful in testing certain types of analog circuits, such as oscillators. Accordingly, the present inventors developed a new type of skew lot, based on increasing or decreasing gate-to-source capacitance of transistors, or more generally a transistor characteristic other than transconductance. This new type of skew lot is particularly suitable for simulating, testing, and/or making yield predictions for oscillators and other CMOS analog circuits.

19 Claims, 5 Drawing Sheets

US 6,912,698 B1

SKEW LOTS FOR IC OSCILLATORS AND OTHER ANALOG CIRCUITS

TECHNICAL FIELD

The present invention concerns fabrication and testing of integrated circuits, such as integrated oscillators and other analog circuits using CMOS technology.

BACKGROUND

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then "wired," or interconnected, together to define a specific electric circuit, such as an oscillator.

In mass-producing thousands of integrated circuits, each of which includes thousands or millions of interconnected transistors, the inevitable variances in fabricating each transistor mean that each circuit will not function exactly as intended by its designers. In fact, some of the circuits will operate slower than intended, and some of the devices will operate faster than intended. Those that operate too slow or too fast, that is, outside an acceptable range, will be discarded as waste. The percentage of the fabricated circuits that operate in the acceptable range define the manufacturing yield. A higher yield percentage means less waste and lower fabrication cost, whereas a lower yield percentage means greater waste and higher fabrication cost.

To determine whether a particular circuit can be economically produced in mass quantities, it is common practice for designers to ask fabricators to deliberately skew or alter the fabrication process to produce test sets of slow and fast circuits, known generally as skew lots. The fast and slow skew lots are made by skewing transistor dimensions, such as gate-insulator thickness (t) and channel length (L), to increase or decrease transconductance—a transistor property known to affect switching speed.

More precisely, since transconductance increases as the product of L and t decreases, fabricators reduce both L and t to make fast skew lots. Conversely, since transconductance decreases as the Lt product increases, they increase both L and t to make slow skew lots. Designers' then test performance of these skew lots to predict or estimate the manufacturing yield of the circuit. The yield, in turn, tells designers whether the circuit design is acceptable or needs alterations to make fabrication more economical.

One problem that the present inventors identified with conventional skew lots is that for certain types of CMOS circuits (circuits that use complementary metal-oxide-semiconductor transistors), the performance of the fast and slow circuits is very similar, meaning that these skew lots are of little use in predicting manufacturing yield. For example, in conventional skew lots of CMOS oscillators (an oscillator is a circuit that outputs a signal that varies back and forth (continuously or discretely ) between two voltage or current levels at a fixed or adjustable frequency), the speed of the so-called fast and slow oscillators were essentially identical in performance and thus were relatively useless in predicting yield for the oscillators.

Accordingly, the inventors recognized a need to devise new types of skew lots for CMOS oscillators and other types of circuits.

SUMMARY

To address these and other needs, the present inventors developed a new type of skew lot suitable for simulating, testing, and/or making yield predictions for circuits, such as oscillators. In contrast to conventional skew lots which are based on increasing or decreasing the transconductance of the transistors of a particular circuit, the new type of skew lot is based on increasing or decreasing a non-transconductance characteristic, such as the gate-to-source capacitance of the transistors.

One exemplary skew lot includes identically-configured fast and slow versions of an integrated circuit. The fast versions, which exhibit a decreased gate-to-source capacitance, include transistors with shorter than normal channels and thicker than normal gate insulators. And, the slow versions, which exhibit an increased gate-to-source capacitance, include field-effect transistors with longer channels and thinner gate insulators.

DETAILED DESCRIPTION OF EXEMPLARY EMBODIMENTS

The following detailed description, which references and incorporates the above-identified figures, describes and illustrates one or more specific embodiments of the invention. These embodiments, offered not to limit but only to exemplify and teach, are shown and described in sufficient detail to enable those skilled in the art to implement or practice the invention. Thus, where appropriate to avoid obscuring the invention, the description may omit certain information known in the art.

Exemplary Skew Lots

Figure 1:
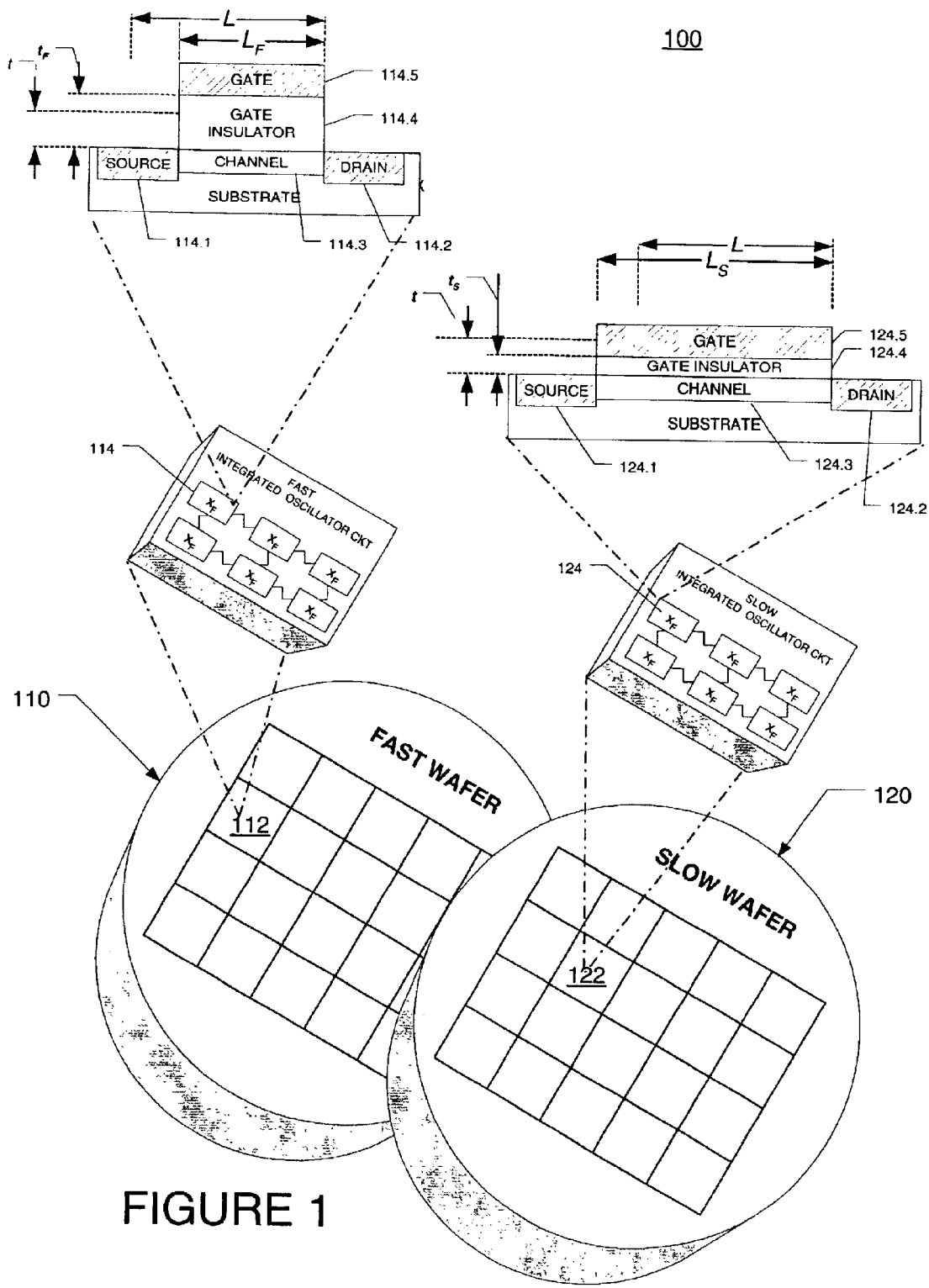
FIG. 1 is a conceptual diagram of an exemplary skew lot 100 incorporating the present invention.

FIG. 1 shows an exemplary skew lot 100 incorporating teachings of the present invention. Skew lot 100 includes at least one fast wafer 110 and at least one slow wafer 120. Some exemplary lots include 24 eight-inch wafers. (As used herein, the terms "fast" and "slow" refers to the operational speed or frequency of a circuit or circuit components relative to a nominal or average operational speed or frequency of the circuit. In a particular context, the terms can also refer to the corresponding dimensions or physical characteristics of one circuit relative to another. For example, a fast circuit not only operates at a higher speed or frequency than its corresponding nominal or average circuit, but also has corresponding dimensions or physical traits designated "fast" relative to those of the nominal or average circuit.

Figure 2:
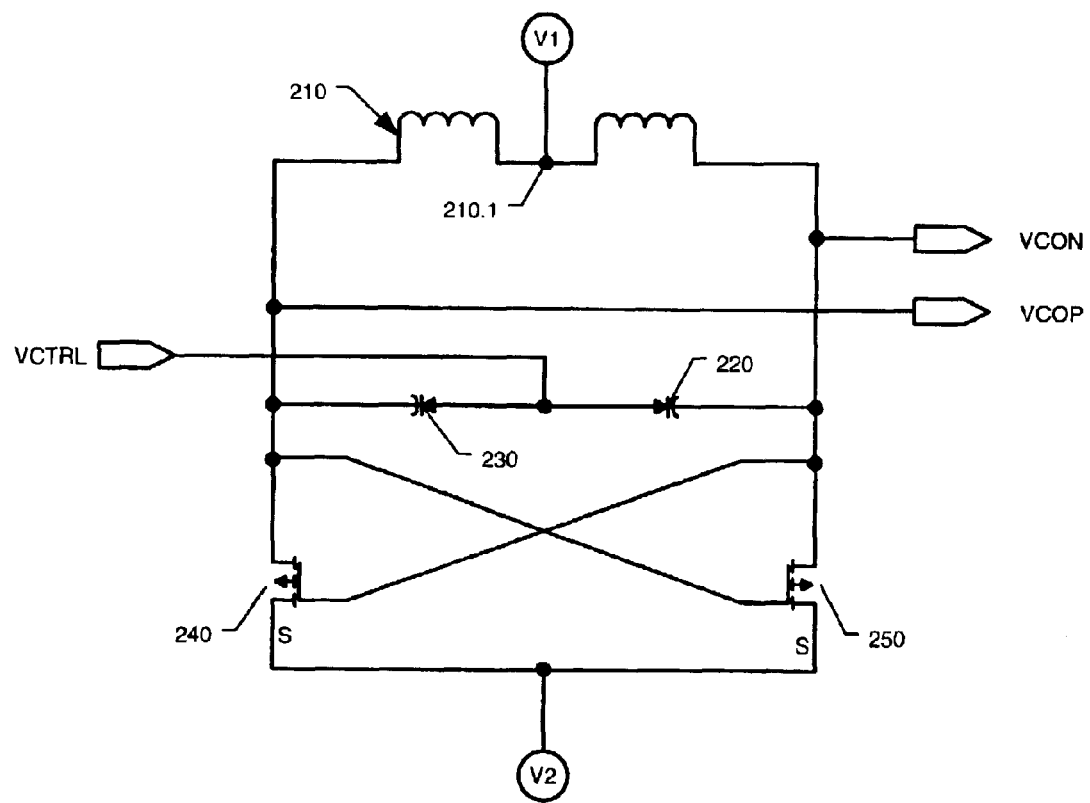
FIG. 2 is a schematic of an exemplary LC oscillator circuit suitable for use with the present invention.
Figure 5:
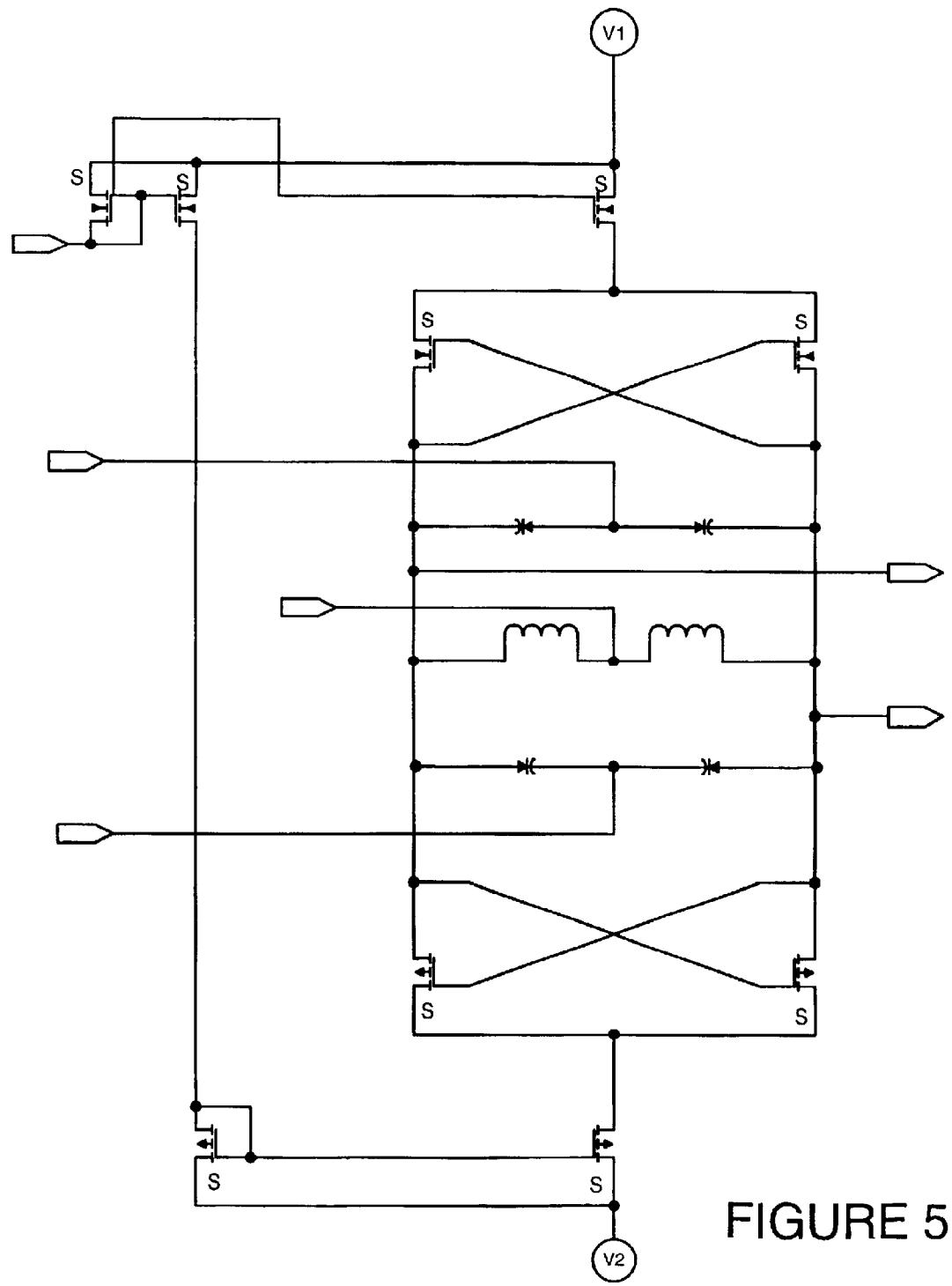
FIG. 5 is a schematic of another exemplary oscillator circuit suitable for use with the present invention.

Fast wafer 110 includes a number of substantially identical fast integrated-circuits, such as integrated circuit 112. Integrated circuit 112, for example, a negative-resistance (or LC) oscillator, such as that shown in circuit 200 of FIG. 2. Circuit 200 includes supply nodes V1 and V2, outputs VCON and VCOP, a center-tapped inductor 210, accumulation-mode metal-oxide-semiconductor (MOS) varactors 220 and 230, and cross-coupled field-effect transistors 240 and 250. Another exemplary oscillator circuit suitable for use with the present invention is shown in FIG. 5. Other types of analog CMOS circuits that may benefit from the present invention include differential amplifiers, sampling comparators, and bias circuits.

More generally, the circuit includes a number of substantially identical fast n- or p-channel metal-oxide-semiconductor field-effect transistors (mosfets), such as fast mosfet 114, which have been skewed in fabrication to have a less than nominal or average gate-to-source capacitance $C_{gs}$. For operation in the saturation region, $C_{gs}$ is defined as $$C_{gs} = \frac{2}{3} C_{ox} WL$$

where W denotes channel width; L denotes channel length; and $C_{ox}$ denotes gate-oxide (or more generally gate-insulation) capacitance. (Capacitance variation is also relevant for sub-threshold regions, but variation in these regions has negligible effect on the speed of the field-effect transistors.) Given that $C_{ox}$ is defined as the ratio of the gate-insulation permittivity $\epsilon$ to the gate-insulator thickness t, the expression for $C_{gs}$ can be rewritten as $$C_{gs} = \frac{2}{3} W \varepsilon \frac{L}{t}$$

which reveals that the magnitude of the gate-to-source capacitance $C_{gs}$ and thus the relative speed of certain types of integrated circuits can be controlled, for example, by regulating the nominal or average L/t ratio relative to a benchmark, such as a nominal or average $L_n/t_n$. Fast mosfet 114, for instance, has a low L/t ratio and thus exhibits less gate-to-source capacitance, which in turn translates into faster operation.

More particularly, fast mosfet 114 includes a source region 114.1, a drain region 114.2, a channel region 114.3, a gate insulator 114.4, and a gate 114.5. Source region 114.1 and drain region 114.2 define a fast-channel length $L_F$ of channel region 114.3. Fast-channel length $L_F$ is less than a nominal or average length $L_n$, such as 0.25 or 0.18 microns. In the exemplary embodiment, length $L_F$ is approximately 7 percent less than length $L_n$ for n-channel transistors and 5 percent less for p-channel transistors. Another embodiment sets length $L_F$ to be about 10 percent less than length $L_n$ for n-channel and 7 percent for p-channel transistors. The invention, however, is not limited to a particular fast-channel length.

Gate insulator 114.4, which is sandwiched between channel region 114.3 and gate 114.5, has a fast-insulator thickness $t_F$ that is greater than a nominal or average thickness $t_n$, for example 4.2 nanometers (nm). In the exemplary embodiment, thickness $t_F$ is approximately 6 percent greater than thickness $t_n$. Other embodiments set thickness $t_F$ to be about 10 percent greater than thickness $t_n$. The invention is not limited to a particular fast-insulation thickness.

In contrast to fast wafer 110, slow wafer 120 includes a number of substantially identical slow integrated-circuits, such as integrated circuit 122, which have the same topology as integrated circuit 112. Integrated circuit 122 includes a number of substantially identical slow mosfets, such as slow mosfet 124, which have a high L/t ratio (relative to $L_n/t_n$) and thus exhibit less gate-to-source capacitance, which in turn translates into slower operation.

More particularly, slow mosfet 124 includes a source region 124.1, a drain region 124.2, a channel region 124.3, a gate insulator 124.4, and a gate 124.5. Source region 124.1 and drain region 124.2 define a slow-channel length $L_S$ of channel region 124.3. Slow-channel length $L_S$ is less than channel length $L_n$. In the exemplary embodiment, length $L_F$ is approximately 7 percent less than length $L_n$ for n-channel transistors and 5 percent for p-channel transistors. Other embodiments set length $L_F$ at about 10 percent less than length $L_n$ for n-channel and 7 percent for p-channel transistors. However, the invention is not limited to a particular slow-channel length.

Gate insulator 124.4, which is sandwiched between channel region 124.3 and gate 124.5, has a slow-insulator thickness $t_S$ which is greater than nominal thickness $t_n$. In the exemplary embodiment, thickness $t_S$ is approximately 6 percent greater than thickness $t_n$ for both n- and p-channel transistors; another embodiment sets thickness $t_S$ at about 10 percent greater than thickness $t_n$. The invention is not limited to a particular slow-insulator thickness variation.

In the exemplary fast and slow circuits, all the constituent transistors of the circuits are fast or slow. However, other embodiments make only a select set of the constituent transistors fast or slow. The select set of transistors has a greater impact on circuit speed than other transistors in the circuit.

Table 1 provides a side-by-side comparison of conventional skew lot dimensions and the exemplary skew lot dimensions.

TABLE 1

Conventional Skew Lot Dimensions vs. Exemplary Skew Lot Dimensions for Constant Channel Width

|  | Gate Insulator Thickness relative to normal thickness | Channel Length relative to normal length |
|---|---|---|
| Conventional Fast Circuit | Thinner | Shorter |
| Exemplary Fast Circuit | Thicker | Shorter |
| Conventional Slow Circuit | Thicker | Longer |
| Exemplary Slow Circuit | Thinner | Longer |

Table 1 shows that conventional CMOS skewing, skews the gate-insulator thickness and channel length in the same direction (that is, by increasing both the thickness and the length or by decreasing both the thickness and length) to achieve its fast and slow performance extremes based on transconductance. On the other hand, the exemplary embodiment skews the gate-insulator thickness and channel length in opposite directions to achieve its performance extremes based on capacitance, or more generally, a transistor characteristic other than transconductance.

Figure 3:
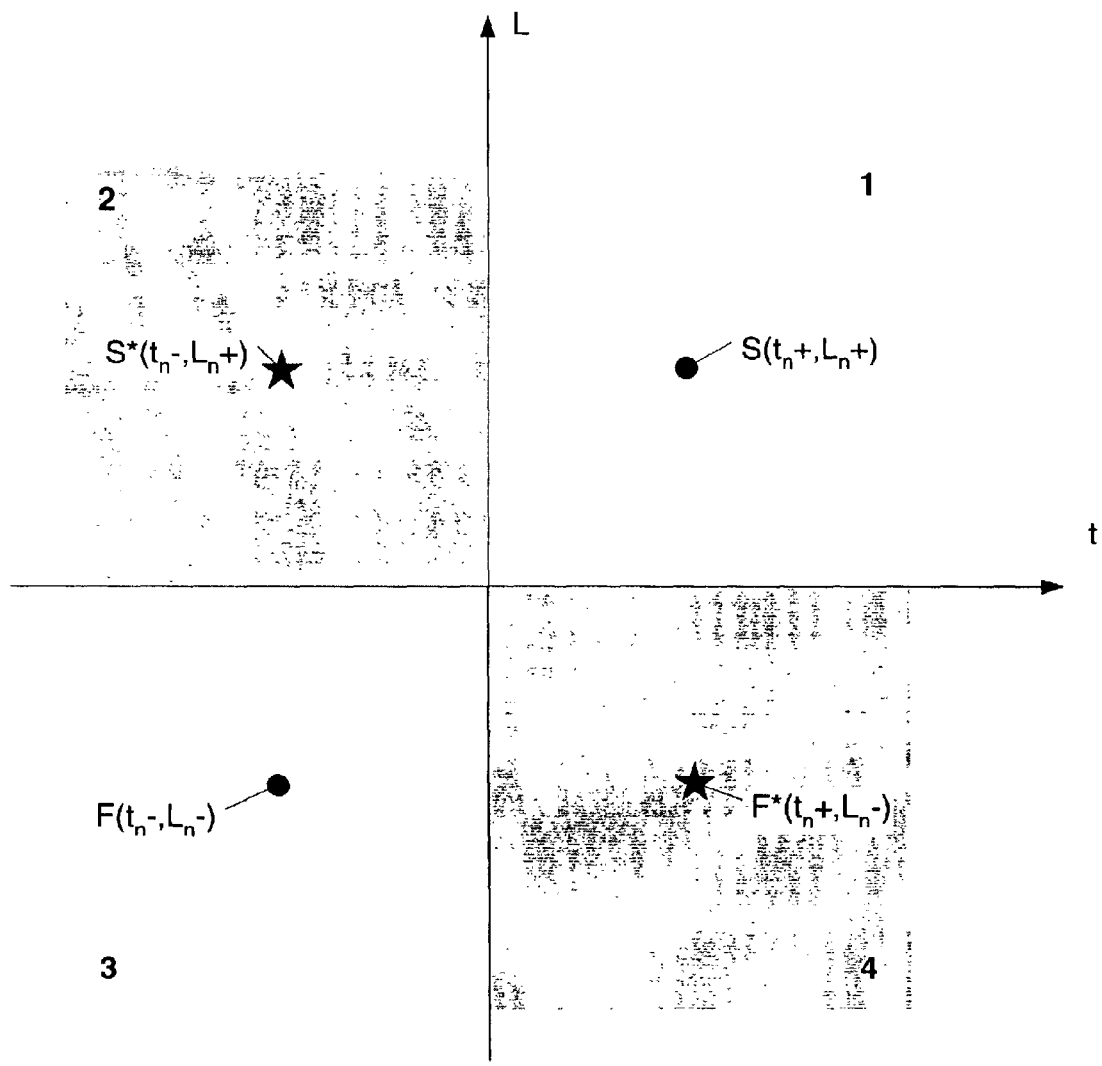
FIG. 3 is a graph showing a comparison of conventional process variance for CMOS integrated circuits and an exemplary process variance in accord with the present invention.

FIG. 3 shows this difference between the exemplary CMOS skew lot and conventional CMOS skew lot in a different way. Specifically, FIG. 3 shows a two-dimensional space 300 representing all possible variations of the two transistors traits, gate-insulator thickness and channel length, around a nominal point N ($t_n$, $L_n$). The conventional slow and fast skew lots rely on skewing the dimensions for both transistors features in the same direction, and thus use respective quadrants I and III, as indicated by slow skew point S($t_n$+, $L_n$+) and fast skew point F($t_n$−, $L_n$−). In contrast, the exemplary embodiment skews these traits in opposite directions as evidenced by slow skew point S*($t_n$−, $L_n$−) in quadrant II and fast skew point F*($t_n$−, $L_n$−) in quadrant IV. (Note that for convenience the magnitude of variance or maximal skew is assumed to be symmetric (that is, the same magnitude for slow and fast); however, it need not be. Also note that the graph makes no distinction between n- and p-channel devices since their respective skews occupy the same quadrants; however in practice the skews for n-and p-channel can differ.)

Another embodiment of the invention varies transistor channel width in combination with the channel length and insulation thickness to form its slow and fast transistors. The table below summarizes these variances.

TABLE 2

Summary of Parameter Variances for Alternative Embodiment

| Parameter | Nominal or Typical Dimension (nm) | +/− Variation from Nominal (nm) | +/− % Variation from Nominal |
|---|---|---|---|
| Tox_nfet | 4.2 | 0.25 | 5.95% |
| L_nfet | 180* | 13 | 7.2% |
| W_nfet | 1800** | 13 | 0.72% |
| Tox_pfet | 4.2 | 0.25 | 5.95% |
| L_pfet | 180* | 9 | 5.0% |
| W_pfet | 1800** | 9 | 0.5% |

NOTES: (*)The "typical" value for L is for a 0.18 micron process. In many circuits designed in this process, L values range from 180 nm to 1000 nm (or even larger). (**)This embodiment follows the common practice of making the channel width W ten times larger than the channel length. In many circuits, the channel width ranges from 300 nm to 20000 nm (or even larger).

The dimensions noted are effective dimensions; however, the scope of the invention also includes the drawn dimensions.

Exemplary Fabrication Method

Figure 4:
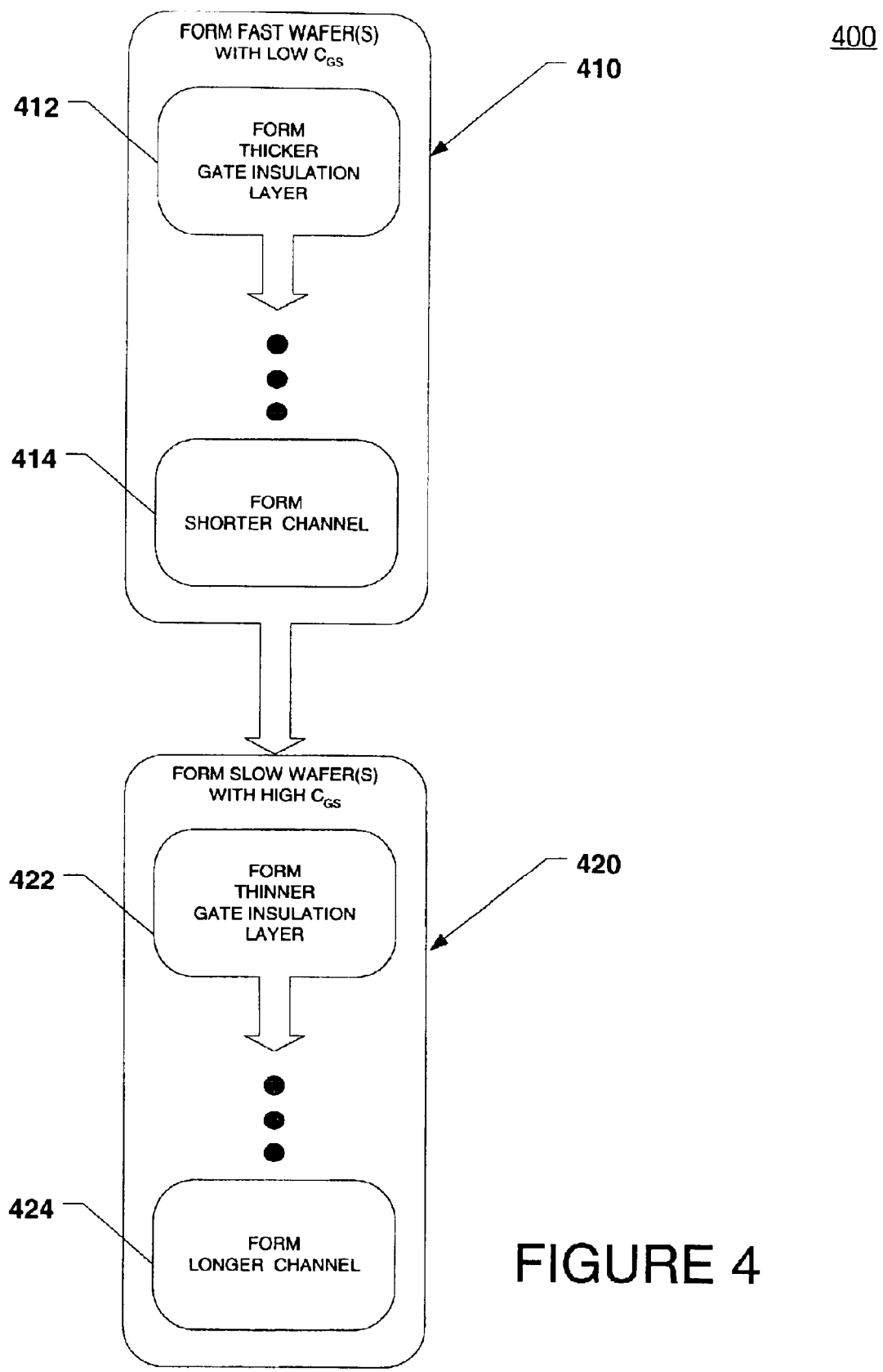
FIG. 4 is a simplified flow chart of an exemplary method of fabricating skew lot 100.

FIG. 4 shows a simplified flow chart 400 of an exemplary method of fabricating the fast and slow wafers of skew lot 100. In particular, the flow chart includes process blocks 410 and 420, with block 410 representing fabrication of fast wafer 110 and block 420 presenting fabrication of slow wafer 120. (Some other embodiments perform blocks 410 and 420 in reverse order or in parallel.) Block 410 includes process blocks 412 and 414. Block 412 entails formation of a thicker gate-insulation layer, and block 414 entails formations of a shorter channel. Similarly, block 420, which represents formation of slow wafer, that is, wafers with higher gate-to-source capacitance, includes process blocks 422 and 424. Block 422 forms a thinner gate-insulation layer, and block 424 forms a longer channel.

More precisely, exemplary fabrication of the fast and slow wafers entails varying or skewing certain aspects of a conventional CMOS fabrication process that is tuned to produce the nominal or average gate-insulator thickness $t_n$ and the nominal or average channel length $L_n$. Specifically, the thicker and thinner gate-insulator thicknesses (that is, fast- and slow-insulator thicknesses $t_F$ and $t_S$) can be achieved in a number of ways. For example, one embodiment forms the thicker and thinner gate insulators by varying the rate of thermal oxidation of a semiconductive substrate for a given time period or holding the rate constant and varying duration of the thermal oxidation procedure. Another embodiment, which relies on deposition to form the gate insulator, varies the deposition rate while holding the deposition time constant or holds the deposition rate constant while varying the deposition time. Still other embodiments grow or deposit insulative material and then use planarization procedures to achieve the desired fast thickness. Thus, the present invention is not limited to a particular method of controlling the thickness of gate-insulation layers.

There are also a number of ways to achieve the shorter and longer channel lengths (fast- and slow-channel lengths $L_F$ and $L_S$). For example, one embodiment varies the length dimension of the gate and forms the source and drain in self-alignment with the gate using ion implantation, thereby varying the channel length. Another embodiment maintains the nominal, lateral gate dimensions and alters the ion-implantation procedure by varying a rate of ion diffusion or increasing the length of an ion-diffusion period. Thus, the present invention is not limited to a particular method of producing the desired channel lengths.

Another aspect of the present invention concerns the modeling and simulation of electrical circuits. In particular, CMOS integrated analog circuits, such as LC oscillators, can also be modeled to include transistors with increased or decreased gate-to-source capacitances. For yield-prediction, however, the gate-to-source capacitances would be based on variation of the nominal gate-insulator thickness and channel widths as described above.

Conclusion

In furtherance of the art, the inventors have presented a new type of skew lot suitable for simulating, testing, and/or making yield predictions for circuits, such as oscillators. In contrast to conventional skew lots which are based on increasing or decreasing the transconductance of the transistors of a particular circuit, the new type of skew lot is based on increasing or decreasing the gate-to-source capacitance of the transistors.

One exemplary skew lot includes identically-configured fast and slow versions of an integrated circuit. The fast versions, which exhibit a decreased gate-to-source capacitance, include transistors with shorter than normal channels and thicker than normal gate insulators. And, the slow versions, which exhibit an increased gate-to-source capacitance, include field-effect transistors with longer channels and thinner gate insulators.

The embodiments described above are intended only to illustrate and teach one or more ways of practicing or implementing the present invention, not to restrict its breadth or scope. The actual scope of the invention, which embraces all ways of practicing or implementing the teachings of the invention, is defined only by the following claims and their equivalents.

What is claimed is:

1. A skew lot for an integrated circuit design including a plurality of field-effect transistors having an average gate-to-source capacitance, the skew lot comprising:

a set of slow integrated circuits configured for test purposes, each slow integrated circuit including a plurality of slow field-effect transistors interconnected according to the integrated circuit design; and a set of fast integrated circuits configured for test purposes, each fast integrated circuit including a plurality of fast field-effect transistors interconnected according to the integrated circuit design;

wherein each transistor in the plurality of field-effect transistors in the integrated circuit design has a nominal gate-insulator thickness (tn) and a nominal channel length (Ln), which define a ratio Ln/tn:

wherein the slow field-effect transistors have an average channel-length-to-gate-insulator-thickness ratio greater than the ratio Ln/tn; and wherein the fast field-effect transistors have an average channel-length-to-gate insulator-thickness ratio less than the ratio Ln/tn.

2. The skew lot of claim 1:

wherein each slow field-effect transistor has a channel length greater than the nominal channel length Ln and a gate-insulator thickness less than the nominal gate-insulator thickness tn; and wherein each fast field-effect transistor has a channel length less than the nominal channel length Ln and a gate-insulator thickness greater than the nominal gate-insulator thickness tn.

3. The skew lot of claim 2:

wherein the channel length of each slow field-effect transistor is at least five percent greater than the nominal channel length Ln;

wherein the gate-insulator thickness of each slow field-effect transistor is at least five percent less than the nominal gate-insulator thickness tn;

wherein the channel length of each fast field-effect transistor is at least five percent less than the nominal channel length Ln; and wherein the gate-insulator thickness of each fast field-effect transistor is at least five percent greater than the nominal gate-insulator thickness tn.

4. The skew lot of claim 1, wherein a first plurality of the transistors are p-channel devices and a second plurality of the transistors are n-channel devices.

5. The skew lot of claim 1, wherein each of the integrated circuits comprises an LC oscillator.

6. A method of making a skew lot for an integrated circuit design including a plurality of field-effect transistors having an average gate-to-source capacitance, the method comprising:

making a set of slow integrated circuits for test purposes, each slow integrated circuit including a plurality of slow field-effect transistors interconnected according to the integrated circuit design, and having an average slow gate-to-source capacitance greater than the average gate-to-source capacitance; and making a set of fast integrated circuits for test purposes, each fast integrated circuit including a plurality of fast field-effect transistors interconnected according to the integrated circuit design; and having an average fast gate-to-source capacitance less than the average gate-to-source capacitance wherein each transistor in the plurality of field-effect transistors in the integrated circuit design has a nominal gate-insulator thickness (tn) and a nominal channel length (Ln), which define a ratio Ln/tn;

wherein the slow field-effect transistors have an average channel-length-to-gate-insulator-thickness ratio greater than the ratio Ln/tn; and wherein the fast field-effect transistors have an average channel-length-to-gate-insulator-thickness ratio less than the ratio Ln/tn.

7. The method of claim 6:

wherein each slow field-effect transistor has a channel length greater than the nominal channel length Ln and a gate-insulator thickness greater than the nominal gate-insulator thickness tn; and wherein each fast field-effect transistor has a channel length less than the nominal channel length Ln and a gate-insulator thickness less than the nominal gate-insulator thickness tn.

8. The method of claim 7:

wherein the channel length of each slow field-effect transistor is at least five percent greater than the nominal channel length Ln;

wherein the gate-insulator thickness of each slow field-effect transistor is at least five percent less than the nominal gate-insulator thickness tn;

wherein the channel length of each fast field-effect transistor is at least five percent less than the nominal channel length Ln; and wherein the gate-insulator thickness of each fast field-effect transistor is at least five percent greater than the nominal gate-insulator thickness tn.

9. The skew lot of claim 6, wherein a first plurality of the transistors are p-channel devices and a second plurality of the transistors are n-channel devices.

10. The skew lot of claim 6, wherein each of the integrated circuits comprises an LC oscillator, with the LC oscillator comprising one or more accumulation-mode metal-oxide-semiconductor varactors.

11. A skew lot for an integrated circuit design including a plurality of field-effect transistors, each having an average channel length and a average gate-insulator thickness, the skew lot comprising:

a set of slow integrated circuits, each slow integrated circuit including a plurality of slow field-effect transistors configured according to the integrated circuit design, with each slow field-effect transistor having a channel length greater than the average channel length and a gate-insulator thickness less than the average gate-insulator thickness; and a set of fast integrated circuits, each fast integrated circuit including a plurality of fast field-effect transistors configured according to the integrated circuit design, with each fast field-effect transistor having a channel length less than the average channel length and a gate-insulator thickness greater than the average gate-insulator thickness; and wherein the channel length of each slow field-effect transistor is at least five percent greater than the average channel length;

wherein the gate-insulator thickness of each slow field-effect transistor is at least five percent less than the average channel length;

wherein the channel length of each fast field-effect transistor is at least five percent less than the average channel length; and wherein the gate-insulator thickness of each fast field-effect transistor is at least five percent greater than the average channel length.

12. The skew lot of claim 11, wherein each of the integrated circuits comprises an LC oscillator.

13. The skew lot of claim 11, wherein a first plurality of the transistors are p-channel devices and a second plurality of the transistors are n-channel devices.

14. A skew lot for an integrated circuit design including a plurality of field-effect transistors, with each transistor having an average channel length and an average gate-insulator thickness, the skew lot comprising:

at least one slow integrated circuit including a plurality of slow field-effect transistors configured according to the integrated circuit design, wherein the slow field-effect transistors have an average slow channel length greater than the average channel length and an average slow gate-insulator thickness less than the average gate-insulator thickness;

wherein the channel length of each slow field-effect transistor is at least five percent greater than the average channel length; and wherein the gate-insulator thickness of each slow field-effect transistor is at least five percent less than the average channel length.

15. The skew lot of claim 14, wherein a first plurality of the transistors are p-channel devices and a second plurality of the transistors are n-channel devices.

16. The skew lot of claim 14, wherein each of the integrated circuit comprises an LC oscillator.

17. A skew lot for an integrated circuit design including a plurality of field-effect transistors, with each transistor having an average channel length and an average gate-insulator thickness, the skew lot comprising:

at least one fast integrated circuit including a plurality of fast field-effect transistors configured according to the integrated circuit design, wherein the fast field-effect transistors have an average fast channel length less than the average channel length and an average fast gate-insulator thickness greater than the average gate-insulator thickness;

wherein each fast field-effect transistor has a channel length at least five percent less than the average channel length; and wherein each fast field-effect transistor has a gate-insulator thickness at least five percent greater than the average channel length.

18. The skew lot of claim 17, wherein a first plurality of the transistors are p-channel devices and a second plurality of the transistors are n-channel devices.

19. The skew lot of claim 17, wherein each of the integrated circuit comprises an LC oscillator.

* * * * *